United States Patent
Arney et al.

(10) Patent No.: US 7,297,374 B1
(45) Date of Patent: Nov. 20, 2007

(54) SINGLE- AND MULTI-PHOTON POLYMERIZABLE PRE-CERAMIC POLYMERIC COMPOSITIONS

(75) Inventors: David S. Arney, St. Paul, MN (US); Feng Bai, Woodbury, MN (US); Robert J. DeVoe, Oakdale, MN (US); Catherine A. Leatherdale, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 313 days.

(21) Appl. No.: 11/024,786

(22) Filed: Dec. 29, 2004

(51) Int. Cl.
*G03F 7/028* (2006.01)
*G03F 7/075* (2006.01)
*C08F 283/00* (2006.01)
*C08J 3/28* (2006.01)

(52) U.S. Cl. ............... 427/510; 522/144; 522/148; 522/172; 522/2; 522/28; 522/29; 522/31; 522/32; 522/63; 522/65

(58) Field of Classification Search ........... 522/172, 522/148, 99, 144, 2, 28, 29, 31, 32, 63, 65; 427/510
See application file for complete search history.

(56) References Cited

U.S. PATENT DOCUMENTS

| | | | |
|---|---|---|---|
| 3,729,313 A | 4/1973 | Smith | |
| 4,642,126 A | 2/1987 | Zador et al. | |
| 4,652,274 A | 3/1987 | Boettcher et al. | |
| 4,816,497 A * | 3/1989 | Lutz et al. | 522/46 |
| 4,859,572 A | 8/1989 | Farid et al. | |
| 5,008,422 A * | 4/1991 | Blum et al. | 556/412 |
| 5,532,288 A * | 7/1996 | Beziers et al. | 522/71 |
| 5,545,676 A | 8/1996 | Palazzotto et al. | |
| 5,770,737 A | 6/1998 | Reinhardt et al. | |
| 5,859,251 A | 1/1999 | Reinhardt et al. | |
| 6,025,406 A | 2/2000 | Oxman et al. | |
| 6,100,405 A | 8/2000 | Reinhardt et al. | |
| 6,245,849 B1 * | 6/2001 | Morales et al. | 524/442 |
| 6,403,750 B1 * | 6/2002 | Pope et al. | 528/25 |
| 6,576,320 B2 * | 6/2003 | Hayashida et al. | 428/64.1 |
| 6,652,978 B2 * | 11/2003 | Lukacs, III et al. | 428/450 |
| 6,750,266 B2 | 6/2004 | Bentsen et al. | |
| 6,852,766 B1 | 2/2005 | DeVoe | |
| 6,902,875 B2 * | 6/2005 | Nagahara et al. | 430/325 |
| 7,005,229 B2 | 2/2006 | Nirmal et al. | |
| 7,091,255 B2 * | 8/2006 | DeVoe | 522/7 |
| 2004/0067431 A1 * | 4/2004 | Arney et al. | 430/138 |
| 2004/0067450 A1 | 4/2004 | Leatherdale et al. | |
| 2004/0068023 A1 | 4/2004 | Leatherdale et al. | |
| 2005/0054744 A1 | 3/2005 | DeVoe | |
| 2005/0112365 A1 * | 5/2005 | Hayashida et al. | 428/336 |
| 2006/0069176 A1 * | 3/2006 | Bowman et al. | 522/1 |

FOREIGN PATENT DOCUMENTS

| | | | |
|---|---|---|---|
| JP | 2000199963 | | 7/2000 |
| JP | 2001296664 A | * | 10/2001 |
| JP | 2003 275671 A | * | 9/2003 |
| WO | WO 00/00335 | | 1/2000 |
| WO | WO01/96409 | | 12/2001 |
| WO | WO 2006/071640 | * | 7/2006 |

OTHER PUBLICATIONS

Birot et al., Chem. Rev. vol. 95, pp. 1443-1477, 1995.
D.F. Eaton, "Advances in Photochemistry", vol. 13, pp. 427-488, 1986.
Freimuth et al., J. Am. Chem. Soc., vol. 79, 1457-1465, 1996.
Konetschny et al., J. European Ceramic Society, vol. 19, pp. 2789-2796, 1999.
Liew et al., Sensors and Actuators, A89, pp. 64-70, 2001.
Liew et al., Sensors and Actuators, A95, pp. 120-134, 2002.
Liu et al., IEEE, pp. 118-121, 2001.
Murray et al., J. Am. Chem. Soc., vol. 115, p. 8706-8715, 1993.

* cited by examiner

*Primary Examiner*—Susan W. Berman
(74) *Attorney, Agent, or Firm*—Lucy Weiss; Daniel Pastirik

(57) ABSTRACT

A single- or multi-photon reactive composition comprises a liquid polysilazane precursor, a multifunctional acrylate additive, and a single- or multi-photon photocuring composition. The invention can be used to provide ceramic-based microstructures as, for example, high temperature resistant materials, including devices such as microcombustors, micro-heat-exchangers, sensor and actuator systems, microfluidic devices, and micro-optics systems that can be used independently or integrated into other systems.

16 Claims, No Drawings

SINGLE- AND MULTI-PHOTON POLYMERIZABLE PRE-CERAMIC POLYMERIC COMPOSITIONS

BACKGROUND

Field

This invention relates to polysilazane- or polysiloxazane-containing compositions useful in providing ceramic-based microstructures for, for example, high temperature electronics, telecommunications, and biological applications.

Ceramic materials are well known and widely used for different applications due to some of their exceptional properties such as high modulus, hardness, high temperature stability and chemical resistance. However they are also heavy, brittle, and difficult to process. On the other hand, organic polymers are tough, flexible, light, and easy to fabricate; low modulus and relatively low decomposition temperatures are their main drawbacks. Pre-ceramic polymer technology is emerging as a promising process to produce materials that share the advantages of both polymers and ceramics while minimizing the disadvantages.

Furthermore new methods are needed to create micron-size (or even smaller) ceramic structures for applications such as microelectronics and microelectromechanical systems (MEMS). A particularly challenging area is creating three-dimensional (3D) ceramic structures. These application areas are very difficult using traditional ceramic technologies. Pre-ceramic polymers afford unique properties in responding to these requirements.

Many polymers such as polysilazanes are known to act as ceramic precursors and their use for production of ceramic structures has been reported. The formation of miniaturized ceramic structures by pyrolysis of poly (vinylsilazane) using LIGA (German Lithographie, Galvanoformung, and Abformung) process including deep X-ray lithography, electroforming, and plastic molding has been demonstrated. An injectable polymer-precursor technique has been detailed; also a microforged mold method to fabricate high temperature MEMS using polysilazanes has been disclosed. All of the described techniques, however, involve complex and time-consuming processing.

Photopolymerization provides an alternative route to construct solid microstructures. Photopolymerization techniques offers direct pattern formation capability, freestanding structures, and cost-effective processing. Through layer-by-layer processes such as stereolithography, photopolymerization techniques can also allow for the fabrication of 3-dimensional structures. Efforts have been made to create ceramic microstructures using free radial inititated photopolymerization of liquid polysilazane; low photopolymerization speed, however, was observed.

Single-photon polymerization techniques have been used to form patterned pre-ceramic polymer microstructures using thiol-ene chemistry including polysilazanes. Two-photon polymerization of polymer nanocomposites has been used to pattern 3D silica microstructures.

SUMMARY

Briefly, the present invention provides a single- or multi-photon reactive composition comprising
  a) a liquid polysilazane precursor,
  b) a multifunctional acrylate additive, and
  c) a single- or multi-photon photocuring composition.

In a preferred embodiment, the invention provides a single or multi-photon reactive composition comprising
  a) a liquid polysilazane precursor,
  b) a multifunctional acrylate additive,
  c) a single- or multi-photon photocuring composition preferably comprising one or both of
    i) a single-photon photocuring composition, and
    ii) a multi-photon photocuring composition comprising at least one multi-photon photosensitizer, and optionally one or both of an electron acceptor and an electron donor.

Preferably, the multi-photon photosensitizer has a two-photon cross-section at least 1.5 times that of fluorescein.

In another aspect of the invention, the present invention provides a method of making a pre-ceramic polymer or a ceramic (which is preferably microstructured) comprising:
  a) providing a multi-photon reactive composition comprising
    i) a liquid polysilazane precursor,
    ii) a multifunctional acrylate additive,
    iii) a multi-photon photocuring composition comprising at least one multi-photon photosensitizer, and optionally one or both of an electron acceptor and an electron donor,
  b) imagewise irradiating the composition (preferably, with a microstructured pattern) with sufficient light to at least partially react the composition, and
  c) optionally, removing a soluble portion of the multi-photon at least partially reacted composition (preferably, to provide a microstructured pre-ceramic polymer), and
  d) optionally, subjecting any remaining portion (which can be the entire at least partially reacted composition, if no removal has been carried out) of the at least partially reacted composition to an elevated temperature for sufficient time to at least partially pyrolyze the polysilazane (preferably, to provide a microstructured ceramic).

This method is advantageous in that it enables three-dimensional (3D) microstructuring of polysilazane materials in a single exposure step. Also, the method provides a composition with improved multi-photon photosensitivity as well as higher crosslink density compared to compositions without multifunctional acrylate additives. The method produces ceramic microstructures without the need for molds and is especially useful for structures of complex topology. Also, by this method ceramic structures can be added to partially completed articles.

In yet another aspect, this invention provides a method of making a pre-ceramic polymer or a ceramic (which is preferably microstructured) comprising:
  a) providing a single-photon reactive composition comprising
    i) a liquid polysilazane,
    ii) a multifunctional acrylate additive, and
    iii) a single-photon photocuring composition,
  b) imagewise irradiating the composition (preferably, with a microstructured pattern) with sufficient light to at least partially react the composition,
  c) optionally, removing a soluble portion of the single-photon at least partially reacted composition (preferably, to provide microstructured pre-ceramic polymer), and
  d) optionally, subjecting any remaining portion (which can be the entire at least partially reacted composition, if no removal has been carried out) of the at least partially reacted composition to an elevated temperature of sufficient time to at least partially pyrolyze the polysilazane (preferably, to provide a microstructured ceramic).

This method is advantageous in that it provides a composition with improved single-photon photosensitivity, resulting in generally reduced manufacturing time. It also provides the advantages described above for the multi-photon reactive composition.

In addition to a single-photon method of photoinitiating a polysilazane-containing/multi-functional acrylate-containing reactive composition the present invention provides a method of multi-photon photosensitizing a polysilazane-containing and multi-functional acrylate-containing photoreactive composition. The multi-photon method comprises irradiating (preferably, pulse irradiating) the composition with light sufficient to cause simultaneous absorption of at least two photons, thereby inducing at least one radical-initiated chemical reaction where the composition is exposed to light. The photoreactive composition comprises: (a) at least one polysilazane-containing and at least one multi-functional acrylate-containing reactive species that is capable of undergoing a radical-initiated chemical reaction (preferably, a curable species selected from the group consisting of monomers, oligomers, and reactive polymers); and (b) at least one multi-photon photocuring composition.

The method of the invention provides enhanced multi-photon photosensitivity by combining (in photochemically-effective amounts) at least one multi-photon photosensitizer having a relatively large two-photon absorption cross section (compared to those of many commonly available dyes) with optionally one or both of an electron acceptor and an electron donor so as to efficiently form a polymerization-initiating species (radicals, etc.). The increased sensitivity of the method of the invention provides utility by, for example, allowing rapid fabrication of three-dimensional structures by means of three-dimensional light patterns and permitting the use of lower peak intensity lasers (including, for example, robust industrial lasers such sa nanosecond and picosecond Nd:YAG lasers) for exposure.

It is believed novel in the art to produce patterned pre-ceramic microstructures by use of single- and multi-photon polymerization of polysilazane/multi-functional acrylate-containing receive compositions that are free of thiols, i.e., free of —SH containing compounds. The multi-photon technology enables fabrication of hollow or solid, three-dimensional microstructures with submicron resolution in a single exposure/development cycle. Complex 3-D geometries can be fabricated that cannot be formed by other methods such as molding or powder pressing.

To the best of our knowledge, single and multi-photon photocuring compositions have never been disclosed for a combination of polysilazane and multi-functional acrylate polymerization.

DEFINITIONS

As used in this patent application:

"a", "an", and "the" are used interchangeably with "at least one" to mean one or more of the elements being described;

"cure" means to effect polymerization and/or to effect crosslinking;

"electronic excited state" means an electronic state of a molecule that is higher in energy that the molecule's electronic ground state that is accessible via absorption of electromagnetic radiation, and that has a lifetime greater than $10^{-13}$ seconds;

"ethylenically unsaturated group" refers to a moiety having at least one carbon-carbon double bond;

"heteroalkyl" means an alkyl group containing at least one non-interfering (with reaction of the reactive species) hetero atom, the hetero atoms preferably being oxygen, nitrogen, and sulfur;

"exposure system" means an optical system plus a light source;

"multi-photon absorption" means simultaneous absorption of two or more photons to each an electronic excited state that is energetically inaccessible by the absorption of a single photon of the same energy.

"optical system" means a system for controlling light, the system including at least one element chosen from refractive optical elements such as lenses, reflective optical elements such a s mirrors, and diffractive optical elements such as gratings. Optical elements shall also include diffusers, waveguides, and other elements known in the optical arts;

"photochemically effective amounts" means amounts sufficient to enable the reactive species to undergo the desired reaction under the selected exposure conditions (as evidenced, for example, by a change in density, viscosity, color, pH, refractive index, or other physical or chemical property);

"photoinitiator" means a molecule that can be an electron acceptor that absorbs light, reaches an excited state, then degenerates to create a polymerization initiating species;

"photosensitizer" means a molecule that lowers the energy required to activate a photoinitiator by absorbing light of lower energy than is required by the photoinitiator for activation and interacting with the photoinitiator or electron acceptor to produce a photoinitiating species therefrom or itself is a molecule that initiates photo polymerization by absorbing light;

"polysilazane" refers to compounds having at least one of a linear, branched, or cyclic backbone comprising at least one Si—N linkage; these compounds comprise at least one ethylenically-unsaturated group or a SiH group;

"polysiloxazane" refers to compounds having at least one of a linear, branched, or cyclic backbone comprising both Si—N and Si—O linkages; for simplicity, in this application, "polysilazane" also includes "polysiloxazane" and "polyureasilazane";

"polyureasilazane" refers to compounds having at least one linear, branched, or cyclic backbone comprising at least one Si—Ni linkage and having at least one carbonyl group bonded to each of two nitrogen atoms;

"simultaneous" means two events that occur within the period of $10^{-14}$ seconds or less;

"substituted aryl" group means an aryl group substituted by non-interfering (with reaction of the reactive species) atoms such as one or more of halogens, alkyl groups, heteroalkyl groups, ethylenically-unsaturated groups;

"sufficient light" means light of sufficient intensity and appropriate wavelength to effect single- or multi-photon absorption; and "three-dimensional light pattern" means an optical image wherein the light energy distribution resides in a volume or in multiple planes and not in a single plane.

DETAILED DESCRIPTION

Polysilazanes

Useful polysilazanes, all of which can be random, alternating, or block polymers, included those linear polysilazanes generally represented by Formula I,

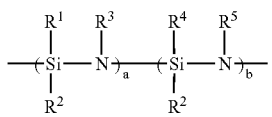

Formula I wherein $R^1$ and $R^2$ are independently H, a linear, branched, or cyclic aliphatic group having less than 9 carbon atoms, a linear, branched, or cyclic heteroalkyl group having less than 7 carbon atoms, a substituted or unsubstituted aryl group having less than 13 carbon atoms, an ethylenically unsaturated group, or where $R^1$ and $R^2$, taken together, may form a ring having less than 8 carbon atoms; $R^3$ and $R^5$ are independently H, a linear or branched alkyl group having less than 7 carbon atoms, or a linear or branched heteroalkyl group having less than 7 carbon atoms; $R^4$ is H or an ethylenically unsaturated group; a and b represent mole fractions such that the sum of a and b is 1, b is greater than zero, and preferably a is greater than b. The number average molecular weight of the polysilazanes of Formula I can range from about 160 g/mol to about 10,000 g/mol, preferably from about 300 g/mol to about 7,000 g/mol, more preferably from about 500 g/mol to about 3,000 g/mol, and most preferably from about 700 g/mol to about 2,000 g/mol.

Examples of useful cyclic polysilazanes include those generally represented by Formula II,

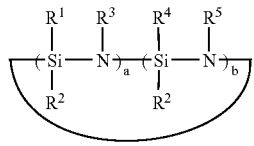

Formula II wherein $R^1$, $R^2$, $R^3$, $R^4$, $R^5$, a, and b are as described for the polysilazanes of Formula I. The number average molecular weight of the cyclic polysilazanes of Formula II can range from about 160 g/mol to about 3,000 g/mol, preferably from about 300 g/mol to about 2000 g/mol, and more preferably from about 350 g/mol to about 1500 g/mol. Examples of other useful cyclic polysilazanes include those that include both linear and cyclic polysilazanes moieties.

Examples of useful branched polysilazanes also include those generally represented by Formula I (linear polysilazanes with branches) or Formula II (cyclic polysilazanes with branches) where either or both of $R^1$ and $R^2$ in at least one or more of the repeat units of the polysilazanes have the structure represented by Formula III

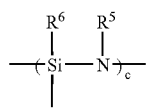

Formula III wherein $R^5$ is as described for Formula I, $R^6$ is H, a linear, branched, or cyclic aliphatic group having less than 9 carbon atoms, a linear, branched, or cyclic heteroalkyl group having less than 7 carbon atoms, a substituted or unsubstituted aryl group having less than 13 carbon atoms, an ethylenically unsaturated group, and c represents a mole fraction such that the sum of a, b, and c is 1, b is greater than zero, preferably b is greater than c, c is greater than zero, and preferably a is greater than b. The number average molecular weight of the branched polysilazanes can range from about 160 g/mol to about 3,000 g/mol, preferably from about 300 g/mol to about 2000 g/mol, and more preferably from about 350 g/mol to about 1500 g/mol. Examples of other useful branched polysilazanes include those that include multiple branches and those that include cyclic polysilazane moieties.

Polysilazanes that include Si—O units in addition to Si—N units are called polysiloxazanes and are useful in the present invention.

Useful linear polysiloxazanes include those generally represented by Formula IV,

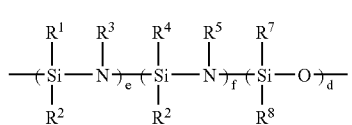

Formula IV wherein $R^1$, $R^2$, $R^7$, and $R^8$ are independently H, a linear, branched, or cyclic aliphatic group having less than 9 carbon atoms, a linear, branched, or cyclic heteroalkyl group having less than 7 carbon atoms, a substituted or unsubstituted aryl group having less than 13 carbon atoms, an ethylenically unsaturated group, or where $R^1$ and $R^2$, or $R^7$ and $R^8$, each pair independently taken together, form a ring having less that 8 carbon atoms; $R^3$ and $R^5$ are independently H, a linear or branched alkyl group having less than 7 carbon atoms, or a linear or branched heteroalkyl group having less than 7 carbon atoms; $R^4$ is H or an ethylenically unsaturated group; e, f, and d represent mole fractions such that the sum of e, f, and d is 1, f and d are each greater than zero, and preferably e is greater than both of f and d. The number and average molecular weight of the polysiloxazanes of Formula IV can range from about 160 g/mol to about 10,000 g/mol, preferably from about 300 g/mol to about 7,000 g/mol, more preferably from about 500 g/mol to about 3,000 g/mol, and most preferably from about 700 g/mol to about 2,000 g/mol.

Useful polysiloxazanes may be cyclic or branched. Useful cyclic polysiloxazanes include polysiloxazanes that have cyclic portions that include Si—O linkages and polysiloxazanes in which the Si—O linkages are not in the cyclic portion. Useful branched polysiloxazanes include polysiloxazanes that are branched at either or both the Si—N or the Si—O linkages.

A particularly useful commercially available polysilazane, KiON VL 20 (available from KiON Corp, Huntington Valley, Pa), has the structure

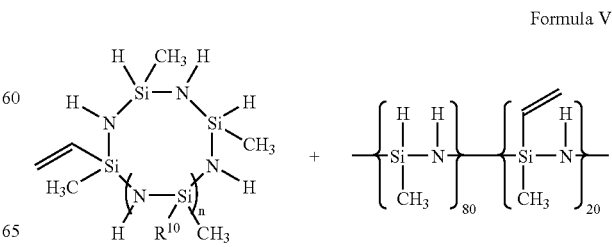

Formula V wherein n is an integer of 1-20, and $R^{10}$ can be H or a vinyl group.

Polysilazanes that include carbonyl groups that are bonded to each of two nitrogen atoms are called polyureasilazanes and are useful in the present invention.

Useful linear polyureasilazanes include those generally represented by Formula VI,

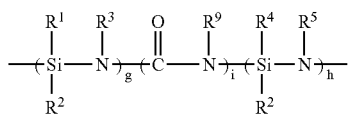

Formula VI wherein $R^1$, $R^2$, $R^3$, $R^4$, and $R^5$ are as described for the polysilazanes of Formula I, $R^9$ is H, a linear, branched, or cyclic aliphatic group having less than 7 carbon atoms, g, h, and i represent mole fractions such that the sum of g, h, and i is 1, both h and i are greater than zero, and preferably g is greater than h. The number average molecular weight of the polyureasilazanes of Formula VI can range from about 160 g/mol to about 10,000 g/mol, preferably from about 300 g/mol to about 7,000 g/mol, more preferably from about 500 g/mol to about 3,000 g/mol, and most preferably from about 700 g/mol to about 2,000 g/mol.

Useful cyclic polyureasilazanes include those generally represented by Formula VII,

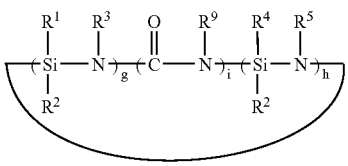

Formula VII wherein $R^1$, $R^2$, $R^3$, $R^4$, $R^5$ are as described for the polysilazanes of Formula I and $R^9$ and g, h, and i are as described for the polyureasilazanes of Formula VI. The number average molecular weight of the cyclic polyureasilazanes of Formula VII can range from about 160 g/mol to about 3,000 g/mol, preferably from about 300 g/mol to about 2000 g/mol, and more preferably from about 350 g/mol to about 1500 g/mol. Examples of other useful cyclic polyureasilazanes include those that include both linear and cyclic polyureasilazanes moieties.

Examples of useful branched polyureasilazanes include those generally represented by Formula VI (linear polyureasilazanes with branches) or Formula VII (cyclic polyureasilazanes with branches) where either or both of $R^1$ and $R^2$ in at least one of the repeat units of the polyureasilazanes have the structure represented by Formula III as described above.

ACRYLATES

The invention includes at least one multi-functional acrylate. A monofunctional acrylate optionally can be used to reduce the crosslink destiny. Acrylates generally preferred include curable species, for example, addition-polymerizable acrylate or methacrylate (hereinafter frequently referred to as (meth)acrylates) monomers and oligomers and addition-crosslinkable acrylate or methacrylate polymers such as free-radically polymerizable or crosslinkable acrylates and methacrylates, and mixtures thereof.

Suitable (meth)acrylates are described, for example, by Palazzotto et al, in U.S. Pat. No. 5,545,676 at column 1, line 65, through column 2, line 26, the description of which is incorporated herein by reference and include mono-, di-, and poly-acrylates and methacrylates (for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, trishydroxyethyl-isocyanurate trimethacrylate, the bis-acrylates and bis-methacrylates of polyethylene glycols of molecular weight about 200-500, copolymerizable mixtures of acrylated monomers such as those of U.S. Pat. No. 4,652,274, and acrylated oligomers such as those of U.S. Pat. No. 4,642,126, the descriptions of which are incorporated herein by reference. Suitable reactive polymers include polymers with pendant (meth)acrylate groups, for example, having from 1 to about 50 (meth)acrylate groups per polymer chain. Examples also preferably include pentaerythritol triacrylate (PETA, Sartomer 344, available from Sartomer Company, Inc., Exton, Pa.) and trimethylolpropane triacrylate (TMPTA) that can be used as multi acrylate additives. Mixtures of two or more monomers, oligomers, and/or reactive acrylate polymers can be used if desired.

Acrylates can be present in the composition in an amount as disclosed below.

MULTI-PHOTON PHOTOSENSITIZERS

Multi-photon photosensitizers suitable for use in the multi-photon photocuring composition of the photoreactive compositions are those that are capable of simultaneously absorbing at least two photons when exposed to sufficient light and that have a two-photon absorption cross-section preferably at least about 1.5 times that of fluorescein.

Preferably, the photosensitizer is soluble in the relative species (if the reactive species is liquid) or is compatible with the reactive species and with any binders (as described below) that are included in the composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313, which is incorporated herein by reference. Using currently available material that test can be carried out as follows:

A standard test solution can be prepared having the following composition: 5.0 parts of a 5% (weight by volume) solution in methanol of 45,000-55,000 molecular weight, 9.0-13.0% hydroxyl content polyvinyl butyral (Butvar™ B76, Solutia, St. Louis, Mo.); 0.3 parts trimethylolpropane trimethacrylate; and 0.03 parts 2-methyl-4,6-bis (trichloromethyl)-s-triazine (see Bull. Chem. Soc. Japan, 42, 2924-2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (FCH™ 650 watt quartz-iodine lamp, General Electric Lighting, Cleveland, Ohio). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis(trichloromethyl)-s-triazine. Since the polymerized areas will be essentially tack-free, the colored powder will selectively adhere essentially only to the tacky, unexposed areas of the coating, providing a visual image corresponding to that in the stencil.

The multi-photon photocuring composition preferably comprises photochemically effective amounts of (1) at least one multi-photon photosensitizer that is capable of simultaneously absorbing at least two photons and that has a two-photon absorption cross-section at least 1.5 times that of fluorescein (generally, greater than about $75 \times 10^{-50}$ cm$^4$ sec/photon, as measured by the method described by C. Xu and W. W. Webb in J. Opt. Soc. Am. B, 13, 481 (1996); (2) optionally, at least one electron donor compound different from the multi-photon photosensitizer and capable of donating an electron to an electronic excited state of the photosensitizer (preferably, an electron donor compound having an oxidation potential that is greater than zero and less than or equal to that of p-dimethoxybenzene); and (3) at least one electron acceptor that is capable of being photosensitized by accepting an electron from an electronic excited state of the photosensitizer, resulting in the formation of at least one free radical (preferably, an electron acceptor selected from the group consisting of sulfonium salts, diazonium salts, azinium salts, chloromethylated triazines, and triarylimidazolyl dimers).

Preferably, a photosensitizer can also be selected based in part upon shelf stability consideration. Accordingly, selection of a particular photosensitizer can depend to some extent upon the particular reactive species utilized (as well as upon the choices of electron donor compound and/or photoinitiator).

Particularly preferred multi-photon photosensitizers include those exhibiting large multi-photon absorption cross-sections, such as Rhodamine B (that is, N-[9-(2-carboxyphenyl)-6-(diethylamino)-3H-xanthen-3-ylidene]-N-ethylethanaminium salts) having the structure

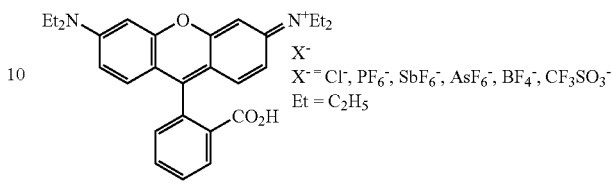

and the four classes of photosensitizers described, for example, by Marder and Perry et al. in International Patent Publication Nos. WO 98/21521 and WO 99/53242, the descriptions of which are incorporated herein by reference. The four classes can be described as follows: (a) molecules in which two donors are connected to a conjugated π (pi)-electron bridge; (b) molecules in which two donors are connected to a conjugated π (pi)-electron bridge which is substituted with one or more electron accepting groups; (c) molecules in which two acceptors are connected to a conjugated π (pi)-electron bridge; and (d) molecules in which two acceptors are connected to a conjugated π (pi)-electron bridge which is substituted with one or more electron donating groups (where "bridge" means a molecular fragment that connects two or more chemical groups, "donor" means an atom or group of atoms with a low ionization potential that can be bonded to a conjugated π (pi)-electron bridge, and "acceptor" means an atom or group of atoms with a high electron affinity that can be bonded to a conjugated π (pi)-electron bridge).

Representative examples of such preferred photosensitizers include the following, wherein Bu is butyl and Me is methyl:

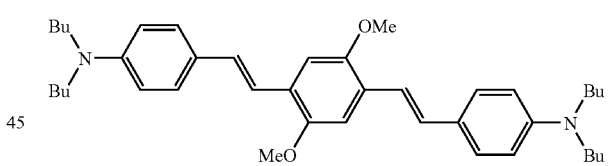

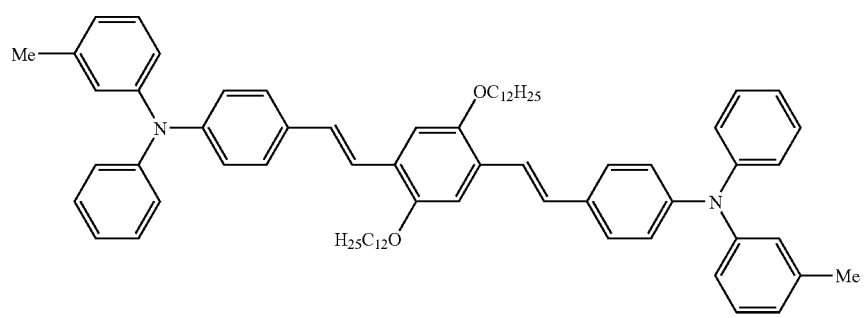

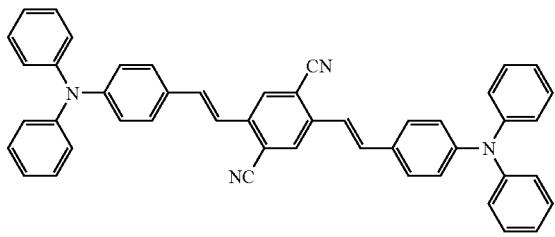

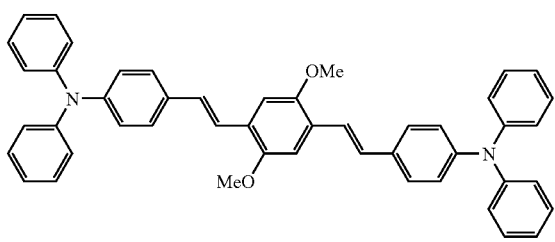

The four above-described classes of photosensitizers can be prepared by reacting aldehydes with ylides under standard Wittig conditions or by using the McMurray reaction, as described in International Patent Publication No. WO 98/21521, the description of which is incorporated herein by reference.

Other compounds are described by Reinhardt et al. (for example, in U.S. Pat. Nos. 6,100,405, 5,859,251, and 5,770,737), the description of which are incorporated herein by reference, as having large multi-photon absorption cross-sections, although these cross-sections were determined by a method other than that described above. Representative examples of such compounds include:

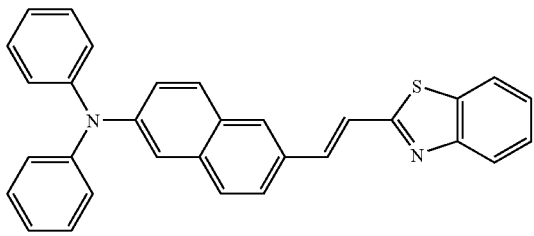

Another class of useful multi-photon photosensitizers are semiconductor nanoparticle quantum dots that are described in US2004/0067431 A1, the description of which is incorporated herein by reference. These include at least one type of semiconductor nanoparticle that has at least one electronic excited state that is accessible by absorption of two or more photons. More particularly, semiconductor nanoparticle quantum dots that can be used as multi-photon photosensitizers in the compositions of the invention include those that have at least one electronic excited state that is accessible by absorption (preferably, simultaneous absorption) of two or more photons. Preferably, the quantum dots are substantially soluble (thus, substantially non-agglomerated) in the reactive species. Preferred nanoparticle quantum dots generally exhibit solubility in the reactive species that is greater than about 1.0 percent by weight (preferably, greater than about 2.0 percent, more preferably, and more preferably greater than about 5.0 percent), based upon the total weight of all components of the photoreactive composition. The nanoparticle quantum dots are preferably sufficiently soluble in the reactive species that the photoreactive composition is optically clear when viewed by the human eye.

Suitable nanoparticle quantum dots generally range in average diameter between about 1 nm and about 50 nm. Preferably, the nanoparticle quantum dots have an average diameter of at least about 1.5 nm; more preferably, at least about 2 nm. The nanoparticle quantum dots are preferably no greater than about 30 nm in average diameter; more preferably, no greater than about 10 nm. Nanoparticle quantum dots having a fairly narrow size distribution are preferred in order to avoid competitive one-photon absorption.

The nanoparticle quantum dots can comprise one or more semiconductor materials. Useful semiconductor materials include, for example, Group II-VI semiconductors (for example, ZnS, ZnSe, ZnTe, CdS, CdSe, CdTe, HgS, HgSe, HgTe, MgTe, and the like), Group III-V semiconductors (for example, GaN, GaP, GaAs, GaSb, InN, InP, InAs, InSb, AlAs, AlP, AlSb, AlS, and the like), Group IV semiconductors (for example, Ge, Si, and the like), Group I-VII semiconductors (for example, CuCl and the like), alloys thereof, and mixtures thereof (for example, ternary and quaternary mixtures). Preferred semiconductor nanoparticle quantum dots comprise a Group IV or a Group II-VI semiconductor (more preferably, a Group II-VI semiconductor, most preferably, a Group II-VI semiconductor comprising zinc or cadmium).

Semiconductor nanoparticles (for example, monoelement semiconductors such as silicon or germanium and compound semiconductors such as GaAs, InP, CdSe, or ZnS) can be synthesized using a wet chemical process based on standard colloidal chemistry. The general synthesis involves the rapid addition (for example, by injection) of molecular precursors of the semiconductor (for example, dimethyl cadmium and trioctylphosphine selenide for CdSe) into a hot coordinating solvent (for example, an amine or phosphine) that can serve to control growth and prevent aggregation of the nanoparticles (see, for example, Murray et al., J. Am. Chem. Soc. 115: 8706 (1993)). In view of the highly reactive nature of the precursors and/or to prevent or minimize oxidation of the growing nanoparticles, the synthesis is generally carried out in an inert atmosphere (for example, a nitrogen atmosphere).

Choice of useful semiconductor nanoparticle quantum dots, details of their preparation, as well as desirable surface treatments to aid in their compatibility and dispersibility in the reactive species is described in US 2004/0067431 A1, the description of which is incorporated herein by reference.

ELECTRON DONOR COMPOUNDS

Electron donor compounds useful in the multi-photon photocuring composition of the photoreactive composition comprise those compounds (other than the photosensitizer itself) that are capable of donating an electron to an electronic excited state of the photosensitizer. Such compounds may be used, optionally, to increase the multi-photon photosensitivity of the photoinitiator system, thereby reducing the exposure required to effect photoreaction of the photoreactive composition. The electron donor compounds preferably have an oxidation potential that is greater than zero and less than or equal to that of p-dimethoxybenzene. Preferably, the oxidation potential is between about 0.3 and 1 volt vs. a standard saturated calomel electrode ("S.C.E.").

The electron donor compound is also preferably soluble in the reactive species and is selected based in part upon shelf stability considerations (as described above). Suitable donors are generally capable of increasing the speed of cure or the image density of a photoreactive composition upon exposure to light of the desired wavelength.

In general, electron donor compounds suitable for use with particular photosensitizers and photoinitiators can be selected by comparing the oxidation and reduction potentials of the three components (as described, for example, in U.S. Pat. No. 4,859,572 (Farid et al.), the description of which is incorporated herein by reference). Such potentials can be measured experimentally (for example, by the methods described by R. J. Cox, "Photographic Sensitivity," Chapter 15, Academic Press (1973)) or can be obtained from references such as N. L. Weinburg, Ed., "Technique of Electroorganic Synthesis Part II Techniques of Chemistry," Vol. V (1975), and C. K. Mann and K. K. Barnes, "Electrochemical Reactions in Nonaqueous Systems" (1970). The potentials reflect relative energy relationships and can be used as described in WO 01/96409 (PCT/US01/19164), the description of which is incorporated herein by reference.

Suitable electron donor compounds include, for example, those described by D. F. Eaton in "Advances in Photochemistry," edited by B. Voman et al., Volume 13, pp. 427-488, John Wiley and Sons, New York (1986); by Oxman et al. in U.S. Pat. No. 6,025,406 at column 7, lines 42-61; and by Palazzotto et al. in U.S. Pat. No. 5,545,676 at column 4, line 14 through column 5, line 18, which descriptions are incorporated herein by reference. Such electron donor compounds include amines (including triethanolamine, hydrazine, 1,4-diazabicyclo[2.2.2]octane, triphenylamine (and its triphenylphosphine and triphenylarsine analogs), and aminoaldehydes, and aminosilanes), amides (including phosphoramides), ethers (including thioethers), ureas (including thioureas), sulfinic acid salts, salts of $(alkyl)_n(aryl)_m$ borates (wherein n+m=4) (tetraalkylammonium salts being preferred), various organometallic compounds such as $SnR_4$ compounds (where each R is independently chosen from among alkyl, aralkyl (particularly, benzyl), aryl, and alkaryl groups) (for example, such compounds as n—$C_3H_7Sn(CH_3)_3$, (allyl)$Sn(CH_3)_3$, and (benzyl)Sn(n—$C_3H_7)_3$), ferrocene, and the like, and mixtures thereof. The electron donor compound can be unsubstituted or can be substituted with one or more non-interfering (with reaction of the reactive species) substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom. Many examples of useful electron donor compounds are described in WO 01/96409, the description of which is incorporated herein by reference.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity).

ELECTRON ACCEPTORS

Suitable electron acceptor compounds for the reactive species of the photoreactive compositions are those compounds (other than the photosensitizer itself) that are capable of being photosensitized by accepting an electron from an electronic excited state of a multi-photon photosensitizer, resulting in the formation of at least one free radical. Such electron acceptors include chloromethylated triazines (for example, 2-methyl-4,6-bis(trichloromethyl)-s-triazine, 2,4,6-tris(trichloromethyl)-s-triazine, and 2-aryl-4,6-bis(trichloromethyl)-s-triazine), diazonium salts (for example phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2' oxy groups bridging adjacent aryl moieties), azinium salts (for example, an N-alkoxypyridinium salt), and triarylimidazolyl dimers (preferably, 2,4,5 triphenylimidazolyl dimers such as 2,2', 4,4',5,5'-tetraphenyl-1,1'-biimidazole, optionally substituted with groups such as alkyl, alkoxy, or halo), and the like, and mixtures thereof.

The electron acceptor is preferably soluble in the reactive species and is preferably shelf-stable (that is, does not spontaneously promote reaction of the reactive species when dissolved therein in the presence of the photosensitizer and the electron donor compound). Accordingly, selection of a particular electron acceptor can depend to some extent upon the particular reactive species, photosensitizer, and electron donor compound chosen, as described above.

Preferred electron acceptors include chloromethylated triazines, triarylimidazolyl dimers (more preferably, 2,4,5-triphenylimidazolyl dimers), sulfonium salts, and diazonium salts. More preferred are chloromethylated triazines and the 2,4,5-triphenylimidazolyl dimers.

SINGLE-PHOTON PHOTOCURING COMPOSITIONS

The single-photon photocuring compositions can be a one-component, a two-component, or a three-component system. A one-component system comprises a photochemically effective amount of at least one one-photon photoinitiator. Examples of such compounds include free radical photoinitiators that generate a free radical source when exposed to radiation having a wavelength in the ultraviolet or visible portion of the electromagnetic spectrum.

Useful free-radical photoinitiators include acetophenones, benzophenones, aryl glyoxalates, acylphosphine oxides, benzoin ethers, benzil ketals, thioxanthones, particularly, isopropylthioxanthone and 2-chlorothioxanthone, chloroalkyltriazines, bisimidazoles, triacylimidazoles, pyrylium compounds, sulfonium salts, mercapto compounds, quinones, azo compounds, organic peroxides, and mixtures thereof.

Such free-radical photoinitiators and methods for their preparation are known in the art. Many are commercially available.

Alternatively, useful two-component and three-component one-photon photoinitiator systems comprise photochemically effective amounts of (1) at least one one-photon photosensitizer; and (2) either or both of (i) at least one electron donor compound different from the one-photon photosensitizer and capable of donating an electron to an electronic excited state of the one-photon photosensitizer (preferably, an electron donor compound having an oxidation potential that is greater than zero and less than or equal to that of p-dimethoxybenzene); and (ii) at least one photoinitiator that is capable of being photosensitized by accepting an electron from an electronic excited state of the one-photon photosensitizer, resulting in the formation of at least one free radical (preferably, a photoinitiator selected from the group consisting of sulfonium salts, diazonium salts, azinium salts, chloromethylated triazines, and triarylimidazolyl dimers).

The one-photon photosensitizer is preferably capable of light absorption somewhere within the range of wavelengths between about 200 and about 800 nanometers (more preferably, between about 200 and 700 nanometers; and, most preferably, between about 300 and about 600 nanometers).

Preferably, the one-photon photosensitizer is substantially free of functionalities that would substantially interfere with the reaction of the reactive species and is soluble in the reactive species (if the reactive species is liquid) or is compatible with the reactive species and with any binders (as described below) that are included in the composition. Most preferably, the one-photon photosensitizer is also capable of sensitizing 2-methyl-4,6-bis(trichloromethyl-s-triazine under continuous irradiation in a wavelength range that overlaps the single photon absorption spectrum of the one-photon photosensitizer (single photon absorption conditions), using the test procedure described in U.S. Pat. No. 3,729,313, at col. 2, line 46 through col. 3, line 10 which is incorporated herein by reference. Using currently available materials, that test can be carried out as described above for multi-functional photosensitizers.

Preferably, a one-photon photosensitizer can also be selected based in part upon shelf stability considerations. Accordingly, selection of a particular photosensitizer can depend to some extent upon the particular reactive species utilized (as well as upon the choices of electron donor compound and/or photoinitiator).

Suitable one-photon photosensitizers are believed to include compounds in the following categories: ketones, coumarin dyes (for example, ketocoumarins), xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriaryl methanes, merocyanines, squarylium dyes, and pyridinium dyes. Xanthene dyes, ketones (for example, monoketones or alpha-diketones), ketocoumarins, aminoarylketones, and p-substituted aminostyryl ketone compounds are preferred one-photon photosensitizers. Mixtures of photosensitizers can also be utilized. For applications requiring high sensitivity, it is generally preferred to employ a one-photon photosensitizer containing a julolidinyl moiety.

In some instances, the photosensitizer can itself photoinitiate polymerization, as, for example, the thioxanthones.

These materials are described in detail in U.S. Pat. No. 6,750,266 B2, the description of which is incorporated herein by reference.

Electron donor compounds for single-photon photocuring compositions can be those disclosed for multi-photon photocuring compositions.

PREPARATION OF PHOTOREACTIVE COMPOSITION

The reactive species (that is, the polysilazanes and the acrylates), multi-photon photosensitizers, electron donor compounds, and electron acceptor compounds useful in the invention can be prepared by the methods described above and in the references cited or by other methods known in the art, and many are commercially available. The components of the invention can be combined under "safe light" conditions using any order and manner of combination (optionally, with stirring or agitation), although it is sometimes preferable (from a shelf life and thermal stability standpoint) to add the photoinitiator (electron acceptor) last (and after any heating step that is optionally used to facilitate dissolution of other components). Solvent can be used, if desired, provided that the solvent is chosen so as to not react appreciably with the components of the composition. Suitable solvents include, for example, acetone, dichloromethane, and acetonitrile. The reactive species itself can also sometimes serve as a solvent for the other components.

The components of the photocuring compositions are present in photochemically effective amounts (as defined above). Generally, the composition can contain at least about 5% (preferably, at least about 10%, more preferably, at least about 20%) up to about 99.79% (preferably, up to about 95%, more preferably, up to about 80%) by weight of one or more reactive species; optionally, up to about 10% (preferably, at least about 0.01%; more preferably, at least about 0.1%; most preferably, at least about 0.2%, preferably, up to about 5%; more preferably, up to about 2%) by weight of one or more photosensitizers; optionally, up to about 10% (preferably, up to about 5%) by weight of one or more electron donor compounds (preferably, at least about 0.1%; more preferably, from about 0.1% to about 5%); and optionally up to about 10% by weight of one or more photoinitiator or electron acceptor compounds (preferably, from about 0.1% to about 5%) based upon the total weight of solids (that is, the total weight of components other than solvent).

The multi-functional acrylate can be present in the reactive composition in the range of about 0.1% to about 50% by weight, based on the weight of the total composition, preferably about 3% to about 30%, more preferably about 10% to about 20% by weight, based on the weight of the total composition.

It may be desirable to add a thermal free-radical initiator to aid in maintaining structural integrity during pyrolysis such as any of organic peroxides, hydroperoxides, acyl peroxides, and azo compounds in an amount 0.001 to 5.0% by weight, based on total solids. Preferred examples include 2,5-bis(tert-butylperoxy)-2,5-dimethyl-3-hexyne, dicumyl peroxide, 1,1-bis-(tert-butylperoxy)-3,3,5-trimethylcyclohexane, and 2,5-dimethyl-2,5-di-(2-ethylhexanoylperoxy) hexane.

A wide variety of adjuvants can be included in the photoreactive compositions, depending upon the desired end use. Suitable adjuvants include solvents, diluents, resins, binders, plasticizers, pigments, dyes, inorganic or organic reinforcing or extending fillers (at preferred amounts of about 10% to 90% by weight based on the total weight of the composition), thixotropic agents, indicators, inhibitors, stabilizers, ultraviolet absorbers, medicaments (for example, leachable fluorides), and the like. The amounts and types of such adjuvants and their manner of addition to the compositions will be familiar to those skilled in the art.

Prior to exposure, the resulting photoreactive compositions can be coated on a substrate, if desired, by any of a variety of coating methods known to those skilled in the art (including, for example, knife coating and spin coating). The substrate can be, for example, a film, sheet, or other surface depending upon the particular application and the method of exposure to be utilized. Preferred substrates are generally sufficiently flat to enable the preparation of a layer of photoreactive composition having a uniform thickness. For applications where coating is less desirable, the photoreactive compositions can alternatively be exposed in bulk form. Following coating, the reactive composition can, optionally, be soft baked (for example on a hot plate or in an oven) to remove some or all of the residual solvent. The substrate can be made of any suitable material (e.g., glass, fused silica, silicon, calcium fluoride) and can be chosen from a wide variety of films, sheets, wafers, and other surfaces, depending upon the particular application and the method of exposure to be utilized. The substrate can optionally be pre-treated with a primer (for example, silane coupling agents) to enhance adhesion of the photoreactive composition to the substrate.

SINGLE-PHOTON EXPOSURE SYSTEM AND ITS USE

Single-photon photoreactive compositions can be photopatterned using standard photolithography techniques such as contact or projection lithography (See for example W. Moreau, Semiconductor Lithography: Principles, Practices, and Materials ($3^{rd}$ Ed.), Plenum Press: New York, 1991). The light source can be any light source that produces actinic radiation (i.e., radiation capable of initiating a photoreaction process) and can, in practice, be any light source that provides sufficient intensity at a wavelength appropriate for the photoinitiator or photosensitizer used in the photoreactive composition. Such wavelengths are generally in the ultraviolet or visible portion of the electromagnetic spectrum and can be in the range of about 150 to about 800 nm; preferably, from about 200 to about 600 nm; more preferably, from about 240 to about 500 nm. Exposure times generally depend upon the type of exposure system used to cause image formation (and its accompanying variables such as numerical aperture, geometry of light intensity spatial distribution, and average light intensity), as well as upon the nature of the photoreactive composition exposed.

MULTI-PHOTON EXPOSURE SYSTEM AND ITS USE

Useful exposure systems for multi-photon curing include at least one light source (usually a pulsed laser) and at least one optical element. Suitable light sources include, for example, femtosecond near-infrared titanium sapphire oscillators (for example, a Coherent Mira Optima 900-F, Santa Clara, Calif.) pumped by an argon ion laser (for example, a Coherent Innova). This laser, operating at 76 MHz, has a pulse width of less than 200 fermtoseconds, is tunable between 700 and 980 nm, and has average power up to 1.4 Watts. However, in practice, any light source that provides sufficient intensity (to effect multi-photon absorption) at a wavelength appropriate for the photosensitizer (used in the photoreactive composition) can be utilized. (Such wavelengths can generally be in the range of about 300 to about 1500 nm; preferably, from about 600 to about 1100 nm; more preferably, from about 750 to about 850 nm. Peak intensities can generally range from at least about $10^6$ W/cm$^2$. The upper limit of the pulse fluence is generally dictated by the ablation threshold of the photoreactive composition.) For example, Q-switched Nd:YAG lasers (for example, a Spectra-Physics Quanta-Ray PRO, Mountain View, Calif.), visible wavelength dye lasers (for example, a Spectral-Physics Sirah pumped by a Spectra-Physics Quanta-Ray PRO), and Q-switched diode pumped lasers (for example, a Spectra-Physics FCbar™) can also be utilized. Preferred light sources are near infrared pulsed lasers having a pulse length less than about $10^{-8}$ second (more preferably, less than about $10^{-9}$ second; most preferably, less than about $10^{-11}$ second). Other pulse lengths can be used provided that the above-detailed peak intensity and pulse fluence criteria are met.

Optical elements useful in carrying out the method of the invention include refractive optical elements (for example, lenses and prisms), reflective optical elements (for example, retroreflectors or focusing mirrors), diffractive optical elements (for example, gratings, phase masks, and holograms), polarizing optical elements (for example, linear polarizers and waveplates), diffusers, Pockels cells, waveguides, waveplates, and birefringent liquid crystals, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture to provide highly-focused light. However, any combination of optical elements that provides a desired intensity profile (and spatial placement thereof) can be utilized. For example, the exposure system can include a scanning confocal microscope (BioRad MRC600, Thornwood, N.Y.) equipped with a 0.75 NA objective (Zeiss 20X Fluar, Carl Zeiss Micro Imaging, Inc., Thornwood, N.Y.).

Generally, multi-photon exposure of the photoreactive composition can be carried out using a light source (as described above) along with an optical system as a means for controlling the three-dimensional spatial distribution of light intensity within the composition. For example, the light from a pulsed laser can be passed through a focusing lens in a manner such that the focal point is within the volume of the composition. The focal point can be scanned or translated in a three-dimensional pattern that corresponds to a desired shape, thereby creating a three-dimensional image of the desired shape. The exposed or illuminated volume of the composition can be scanned either by moving the composition itself or by moving the light source (for example, moving a laser beam using galvo-mirrors).

If the light induces, for example, a reaction of the reactive species that produces a material having solubility characteristics different from those of the reactive species, the resulting image can optionally be developed by removing either the exposed or the unexposed regions through use of an appropriate solvent, for example, or by other art-known means. Cured, complex, three-dimensional objects can be prepared in this manner.

Exposure times generally depend upon the type of exposure system used to cause image formation (and its accompanying variables such as numerical aperture, geometry of light intensity spatial distribution, the peak light intensity during the laser pulse (higher intensity and shorter pulse duration roughly correspond to peak light intensity)), as well as upon the nature of the composition exposed (and its concentrations of photosensitizer, photoinitiator, and electron donor compound). Generally, higher peak light intensity in the regions of focus allows shorter exposure times, everything else being equal. Linear imaging or "writing" speeds generally can be about 5 to 100,000 microns/second using a laser pulse duration of about $10^{-8}$ to $10^{-15}$ second (preferably, about $10^{-11}$ to $10^{-14}$ second) and about $10^2$ to $10^9$ pulses per second (preferably, about $10^3$ to $10^8$ pulses per second).

As disclosed in Assignee's U.S. Patent Publication No. 2004/0068023A1, filed Oct. 2, 2002, (the description of photopatterners of structures of which is incorporated herein by reference), the single or multi-photon reactive radiation induces a reaction in the reactive composition that produces a material having solubility characteristics different from those of the unexposed reactive composition. The resulting pattern of exposed and unexposed material can then be developed by removing either the exposed or the unexposed regions with an appropriate solvent. An optional post exposure bake following exposure but prior to development may be required for certain photoreactive compositions. Reacted, complex, seamless three-dimensional structures can be prepared in this manner.

The resulting structures can have any suitable size and shape, but the method of the invention is particularly well suited for adding a microstructure to a microstructured surface of an article. The structures can be formed on the surface of the article, or within or on a feature of the surface.

The photopatterned structure can be thermally treated (pyrolysis) to convert the pre-ceramic polymer to a ceramic material. Following the polymerization reaction, the resultant polymeric material is typically pyrolyzed to form the ceramic material. For example, depending on the conditions employed for the thermal treatment, amorphous or crystalline structures can be obtained. Amorphous structures are generally obtained particularly when the pyrolysis is carried out in a temperature range from about 700 to 1200° C., preferably from 900 to 1200° C. When the thermal treatment is carried out at higher temperatures, for instance from 1200 to 2000° C., preferably from 1500 to 2000° C., at least partially crystalline structures are typically obtained. Pyrolysis is typically carried out under a protective gas cover or a reaction gas cover (e.g., helium, argon, nitrogen, ammonia, etc.) or in a vacuum. Further, pyrolysis is typically performed for about 0.5 to 2 hours to convert the polymeric material to a ceramic material. Optionally, a ceramic material is subjected to additional processing following pyrolysis. For example, a stable body is typically obtained after a sintering procedure at temperatures of 900° C. up to 2000° C., preferably 1600-2000° C., for 0.5 to 2 hours or more.

After sintering, the structure has a substantially inorganic composition and dimensions that are smaller than prior to the sintering step.

UTILITY

Representative applications for these higher temperature resistant materials include patterned ceramic devices such as microcombustors, micro-heat-exchangers, sensor and actuator systems, microfluidic devices, and micro-optics systems that can be used independently or integrated into other systems, such as microelectromechanical systems. Ceramics that can resist high temperatures are a good alternative to conventional polymeric material because of their superior thermal properties, corrosion and chemical resistance, high modulus, and hardness.

EXAMPLES

Objects and advantages of this invention are further illustrated by the following examples, but the particular materials and amounts thereof recited in these examples, as well as other conditions and details, should not be construed to unduly limit this invention.

Glossary

Unless otherwise noted, all procedures were carried out under a dry nitrogen atmosphere with dry and deoxygenated solvents and reagents. Unless otherwise noted, all solvents and reagents were or can be obtained for Aldrich Chemical Co., Milwaukee, Wis.

As used herein,

"VL20" refers to VL20 curable polysilazanes that were obtained from KiON Corporation, Huntingdon Valley, Pa;

"Dye 1" refers to the multi-photon sensitizing dye bis-[4-(diphenylamino)styryl]-1-(2-ethyhexyloxy),4-(methoxy) benzene;

"TMPTA" refers to trimethylolpropane triacrylate;

"ITX" refers to DAROCURE ITX, available from Ciba Specialty Chemicals, Tarrytown, N.Y.;

"IRGACURE 819" refers to bis(2,4,6-trimethylbenzoyl) phenylphosphine oxide, available from Ciba Specialty Chemicals, Tarrytown, N.Y.;

Preparation of Dye 1, Bis-[4-(diphenylamino) styryl]-1-(2-ethylhexyloxy),4-(methoxy)benzene A mixture of 2,5-bis(chloromethyl)-1-methoxy-4-(2-ethylhexyloxy)benzene (28.26 g), prepared essentially according to the procedure of U.S. Pat. No. 5,189,136 and triethyl phosphite (37.4 g) was heated to reflux for 6 hours. After cooling, the product was heated under high vacuum to remove residual triethyl phosphite. A thick oil was obtained which slowly crystallized after several days and was used without further purification in the following step. To a mixture of the thick oil (11.60 g), 4-diphenylaminobenzaldehyde (12.34 g), and dry tetrahydrofuran (400 mL) was added dropwise potassium t-butoxide (1.0 M in tetrahydrofuran, 44 mL). The mixture was stirred for 3 hours at room temperature, then the solvent was removed under vacuum. Water (100 mL) was added to the residue, and the mixture was extracted several times with methylene chloride. The combined organic layers were washed with brine, dried over anhydrous magnesium sulfate and the solvent was removed under vacuum. The crude product was purified by column chromatography on silica gel using 30/70 methylene chloride/hexane to give 14.44 g of Dye 1, bis-[4-(diphenylamino)stryl]-1-(2-ethyhexyloxy),4-(methoxy)benzene, as a bright green solid. The structure was confirmed by spectral analysis.

Examples 1-3

Curing Poly(vinylsilazanes) By Two-Photon Polymerization

Several drops of a mixture of VL20 (2.00 g), TMPTA (0.30 g), ITX (0.040 g), Dye 1 (0.011 g), and dichloromethane (0.26 g) were placed on each of three clean glass microscope slides between two strips of adhesive tape (SCOTCH 810 MAGIC TAPE, available from 3M Company, St. Paul, Minn.) that were adhered to each slide approximately 1 cm apart. Glass cover slips were then placed over each mixture. Two-photon polymerization was performed using a diode pumped Ti:sapphire laser (Spectra-Physics, Mountain View, Calif.) operating at a wavelength of 800 nm, nominal pulse width 45 fs, pulse repetition rate of 80 mHz, and beam diameter of approximately 1.5 mm. The optical train consisted of low dispersion turning mirrors, a beam expander, an optical attenuator to vary the optical power, an acousto-optic modulator as a shutter, and a computer controlled 2-axis (x-y axes) galvomirror scanning system mounted on a vertical z-axis stage. A 100X oil-immersion Plan Fluorite microscope objective (numerical aperture 1,4, available from Nikon Instruments, Inc., Melville, N.Y.) was used to focus the laser light into the sample. The position of the microscope objective was adjusted to set the focal point at the interface of the polymer composition and the glass slide. Under computer control, the focused laser was rastered to form a series of bars that were approximately 100 microns wide. The scan speed of the laser was varied from 0.67 mm per second to 43 mm per second and the average power of the laser was varied from approximately 7 mW to approximately 12 mW in order to determine the threshold writing speed as a function of average power. The threshold writing speed is the maximum scan speed at a given average power the provides a polymerized structure that remains intact following the development step described below. Following exposure of the samples to the laser, each sample was developed. Each glass slide was washed with acetone to remove unpolymerized poly(vinylsilazanes). After each glass slide was dried in air at room temperature, each was examined using an optical microscope. The data are given in Table 1.

TABLE 1

| Example | Average Power (mW) | Threshold Writing Speed (mm/second) |
|---|---|---|
| 1 | 12 | 2.7 |
| 2 | 8.5 | 1.3 |
| 3 | 7.3 | 0.67 |

The data show superlinear dependence of threshold writing speed on average power in a polymerized patterned pre-ceramic microstructure. Using a similar procedure and composition, patterned pre-ceramic microstructures can be producing using one or both of polysiloxazane and polyureasilazane instead of, or in addition to, polysilazane.

Example 4

Ceramic Structure from One-Photon Polymerized Poly(vinylsilazanes)-Acrylate Composition One side of a glass microscope slide was coated with NORLAND OPTICAL ADHESIVE 81 (available from Norland Products, Cranbury, N.J.) at a thickness of approximately 500 microns. The coating was irradiated through a shadow mask for 2 minutes using a light source comprising a Model 66001 lamp housing (available from Oriel Corp., Stratford, Conn.) and a Model USH-200DP lamp (available from USHIO America, Inc., Cypress, Calif.) that was approximately 4 inches (10 cm) from the coating. The sample was then developed by washing the slide in ethyl acetate to remove uncured adhesive. The sample was then dried in a stream of air for approximately 2 minutes to afford the glass slide with a pattern of cured adhesive on one side. A second glass slide was coated with 3M ESPE EXPRESS 7301 vinyl polysiloxane dental impression material (available from 3M ESPE, St. Paul, Minn.) and this slide was pressed against the slide on which the adhesive was cured so that the EXPRESS dental impression material was in contact with the cured adhesive. The slides were held pressed together for approximately 5 minutes to allow the dental impression material to cure, after which time the slides were separated. The cured dental impression material retained the inverse of the pattern of the cured adhesive and provided a mold for the next step. A mixture of VL20 (4.00 g), TMPTA (0.55 g), tetravinylsilane (1.00 g), platinum(II) acetylacetonate (0.02 g), IRGACURE 819 (0.01 g), dicumyl peroxide (0.04 g), and dichloromethane (5 drops) was poured onto the cured dental impression material on the glass slide to fill the pattern with the mixture. The mixture was irradiated with the Model USH-200DP lamp in the Oriel housing for 2 minutes. After the irradiation was stopped, the sample was allowed to stand at room temperature for approximately 3 hours. The dental impression material mold was carefully peeled off of the cured polysilazanes layer. The cured polysilazanes layer was pyrolyzed in air in a model 3-550 oven (available from Neytech, Bloomfield, Conn.) by heating at a rate of 10° C. per minute to 600° C. for 2 hours, then at 800° C. for two hours, then at 1000° C. for two hours. The oven containing the sample was allowed to cool to room temperature and the ceramic structure was removed. The ceramic structure produced was an accurate replication of the mold. Other useful ceramic structures can be produced using an inert pyrolysing atmosphere.

The cited descriptions contained in the patents, patent documents, and publications cited herein are incorporated by reference in their entirety as if each were individually incorporated. Various unforeseeable modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the inveniton intended to be limited only by the claims set forth herein as follows.

What is claimed is:

1. A composition comprising
   a) a liquid polysilazane precursor,
   b) a multifunctional acrylate additive, and
   c) a multi-photon photocuring composition, comprising a multi-photon photosensitizer, and optionally one or both of an electron acceptor and an electron donor.

2. The composition according to claim 1 wherein said liquid polysilazane precursor comprises one or more units having one or more of the Formulae I, II, and IV:

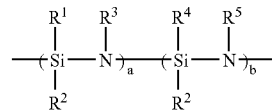

Formula I wherein $R^1$ and $R^2$ are independently H, a linear, branched, or cyclic aliphatic group having less than 9 carbon atoms, a linear, branched, or cyclic heteroalkyl group having less than 7 carbon atoms, an aryl group having less than 13 carbon atoms, an ethylenically unsaturated group, or where $R^1$ and $R^2$, taken together, can form a ring having less than 8 carbon atoms; $R^3$ and $R^5$ are independently H, a linear or branched alkyl group having less than 7 carbon atoms, or a linear or branched heteroalkyl group having less than 7 carbon atoms; $R^4$ is H or an ethylenically unsaturated group; a and b represent mole fractions such that the sum of a and b is 1, and b is greater than zero;

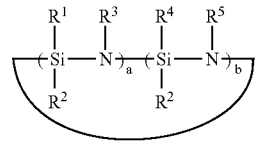

Formula II wherein $R^1$, $R^2$, $R^3$, $R^4$, $R^5$, a, and b are as described from the polysilazanes of Formula I;

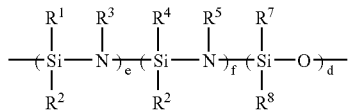

Formula IV wherein $R^1$, $R^2$, $R^7$, and $R^8$ are independently H, a linear, branched, or cyclic aliphatic group having less than 9 carbon atoms, a linear, branched, or cyclic heteroalkyl group having less than 7 carbon atoms, an aryl group having less than 13 carbon atoms, an ethylenically unsaturated group, or where $R^1$ and $R^2$, or $R^7$ and $R^8$, each pair independently taken together, form a ring having less than 8 carbon atoms; $R^3$ and $R^5$ are independently H, a linear or branched alkyl group having less than 7 carbon atoms, or a linear or branched heteroalkyl group having less than 7 carbon atoms; $R^4$ is H or an ethylenically unsaturated group; e, f, and d represent mole fractions such that the sum of e, f, and d is 1, f and d are each greater than zero, and e is greater than both of f and d; and wherein $R^1$ or $R^2$ or both optionally has a structure represented by Formula III:

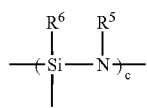

Formula III wherein $R^5$ is as described for Formula I, $R^6$ is H, a linear, branched, or cyclic aliphatic group having less than 9 carbon atoms, a linear, branched, or cyclic heteroalkyl group having less than 7 carbon atoms, an aryl group having less than 13 carbon atoms, an ethylenically unsaturated group, and c represents a mole fraction such that the sum of a, b, and c is 1, is greater than zero, b is greater than c, and a is greater than b.

3. The composition according to claim 1 wherein said liquid polysilazane precursor comprises one or more units having the formula

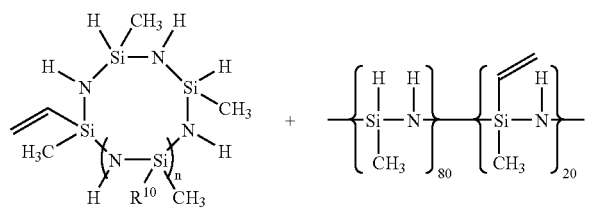

Formula V wherein n is an integer of 1-20 and $R^{10}$ is H or a vinyl group.

4. The composition according to claim 1 wherein said polysilazane precursor comprises a polysiloxazane.

5. The composition according to claim 4 wherein said polysiloxazane has a structure represented by Formula IV

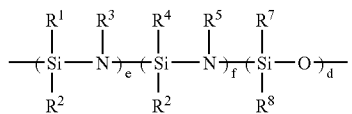

Formula IV wherein $R^1$, $R^2$, $R^7$, and $R^8$ are independently H, a linear, branched, or cyclic aliphatic group having less than 9 carbon atoms, a linear, branched, or cyclic heteroalkyl group having less than 7 carbon atoms, a substituted or unsubstituted aryl group having less than 13 carbon atoms, an ethylenically unsaturated group, or where $R^1$ and $R^2$, or $R^7$ and $R^8$, each pair independently taken together, form a ring having less than 8 carbon atoms; $R^3$ and $R^5$ are independently H, a linear or branched alkyl group having less than 7 carbon atoms; or a linear or branched heteroalkyl group having less than 7 carbon atoms; $R^4$ is H or an ethylenically unsaturated group; e, f, and d represent mole fractions such that the sum of e, f, and d is 1, f and d are each greater than zero.

6. The composition according to claim 1 wherein said polysilazane precursor comprises a polyureasilazane.

7. The composition according to claim 6 wherein said polyureasilazane has a structure represents by at least one of Formula VI and Formula VII:

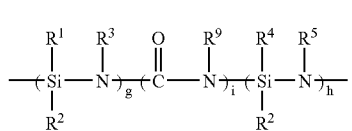

Formula VI wherein $R^1$, $R^2$, $R^3$, $R^4$, and $R^5$ are as described for the polysilazanes of Formula I, $R^9$ is H, a linear, branched, or cyclic aliphatic group having less than 7 carbon atoms, g, h, and i represent mole fractions such that the sum of g, h, and i is 1, both h and i are greater than zero, and preferably g is greater than h.

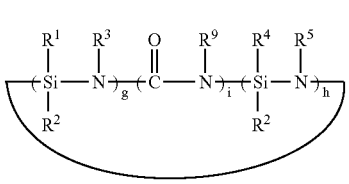

Formula VII wherein $R^1$, $R^2$, $R^3$, $R^4$, and $R^5$ are as described for the polysilazanes of Formula I and $R^9$ and g, h, and i are as described for the polyureasilazanes of Formula VI.

8. The composition according to claim 1 wherein said acrylate comprises one or more of addition-polymerizable acrylate or methacrylate monomers, addition-polymerizable acrylate or methacrylate oligomers, and addition-crosslinkable acrylate or methacrylate polymers.

9. The composition according to claim 1 wherein said multi-photon photosensitizer absorbs at least two photons when exposed to sufficient light and has a two-photon absorption cross-section at least 1.5 times that of fluorescein.

10. The composition according to claim 1 wherein said multi-photon photosensitizer is selected from the group consisting of (a) Rhodamine B; (b) molecules in which two donors are connected to a conjugated π (pi)-electron bridge;

(c) molecules in which two donors are connected to a conjugated π (pi)-electron bridge which is substituted with one or more electron accepting groups; (d) molecules in which two acceptors are connected to a conjugated π (pi)-electron bridge; and (e) molecules in which two acceptors are connected to a conjugated π (pi)-electron bridge which is substituted with one or more electron donating groups.

11. The composition according to claim 1 wherein said multi-photon photosensitizer is a fluorescein salt.

12. The composition according to claim 1 wherein said multi-photon photosensitizer comprises one or more semiconductor quantum dots.

13. The composition according to claim 12 wherein said semiconductor quantum dot comprises one or more of cadmium selenide (CdSe), zinc selenide (ZnSe), cadmium sulfide (CdS) and zinc sulfide (ZnS).

14. The composition according to claim 1 wherein said electron acceptor comprises one or more of chloromethylated triazines, diazonium salts, sulfonium salts, azinium salts, triarylimidazolyl dimers, and mixtures thereof.

15. The composition according to claim 1 wherein said electron donor comprises one or more of amines, amides, ethers, ureas, sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$ borates (wherein n+m=4), $SnR_4$ compounds, where each R is independently chosen from among alkyl, aralkyl (particularly, benzyl), aryl, and alkaryl groups, ferrocene, and mixtures thereof.

16. A method comprising:
   a) providing a single- or multi-photon reactive composition comprising
      i) a liquid polysilazane precursor,
      ii) a multi-functional acrylate additive, and
      iii) a multi-photon photocuring composition comprising a multi-photon photosensitizer, and optionally one or both of an electron acceptor and an electron donor,
   b) imagewise irradiating the composition with sufficient light to at least partially react the composition,
   c) optionally, removing a soluble portion of the at least partially reacted composition, and
   d) optionally, subjecting any remaining portion of the at least partially reacted composition to an elevated temperature for sufficient time to at least partially pyrolyze the polysilazane.

* * * * *

UNITED STATES PATENT AND TRADEMARK OFFICE
CERTIFICATE OF CORRECTION

| | |
|---|---|
| PATENT NO. | : 7,297,374 B1 |
| APPLICATION NO. | : 11/024786 |
| DATED | : November 20, 2007 |
| INVENTOR(S) | : David S. Arney |

It is certified that error appears in the above-identified patent and that said Letters Patent is hereby corrected as shown below:

Col. 1
Line 5, delete "BACKGROUND" and insert the same on Line 13 below "applications." (as a Heading)
Line 51, delete "radial inititated" and insert -- radical initiated --, therefor.

Col. 2
Line 2, delete "single" and insert -- single- --, therefor.

Col. 3
Line 1, delete "of" and insert -- for --, therefor.
Line 38, delete "sa" and insert -- as --, therefor.
Line 43, delete "receive" and insert -- reactive --, therefor.
Line 50, delete "single" and insert -- single- --, therefor.
Line 64, after "energy" delete "that" and insert -- then --, therefor.

Col. 4
Line 10, delete "each" and insert -- reach --, therefor.
Line 12, delete "energy." and insert -- energy; --, therefor.
Line 16, delete "a s" and insert -- as --, therefor. (Consider Space)
Line 46, delete "Si-Ni" and insert -- Si-N --, therefor.
Line 66, delete "included" and insert -- include --, therefor.

Col. 6
Line 39, after "The number" delete "and".
Line 54, after "structure" insert -- : --.

Col. 7
Line 41, after "$R^4$," insert -- and --.
Line 63, delete "destiny." and insert -- density. --. therefor.

UNITED STATES PATENT AND TRADEMARK OFFICE
CERTIFICATE OF CORRECTION

PATENT NO. : 7,297,374 B1
APPLICATION NO. : 11/024786
DATED : November 20, 2007
INVENTOR(S) : David S. Arney It is certified that error appears in the above-identified patent and that said Letters Patent is hereby corrected as shown below:

Col. 8
Line 4, delete "al," and insert -- al. --, therefor.
Line 45, delete "relative" and insert -- reactive --, therefor.

Col. 9
Line 29, delete "(1996);" and insert -- (1996)); --, therefor.
Line 44, delete "consideration." and insert -- considerations. --, therefor.

Col. 11
Line 33, delete "description" and insert -- descriptions --, therefor.
Line 67, delete "percent," and insert -- percent; --, therefor.

Col. 12
Line 56, delete "composition" and insert -- compositions --, therefor.

Col. 13
Line 33, after "analogs)," delete "and".

Col. 14
Line 7, delete "example" and insert -- example, --, therefor.

Col. 15
Line 7, after "200 and" insert -- about --.
Line 16, delete "(trichloromethyl-s-" and insert -- (trichloromethyl)-s- --, therefor.

Col. 16
Line 12, delete "10%," and insert -- 10%; --, therefor.
Line 14, delete "95%," and insert -- 95%; --, therefor.
Line 17, delete "0.2%," and insert -- 0.2%; --, therefor.

UNITED STATES PATENT AND TRADEMARK OFFICE
CERTIFICATE OF CORRECTION

PATENT NO.         : 7,297,374 B1
APPLICATION NO. : 11/024786
DATED                 : November 20, 2007
INVENTOR(S)       : David S. Arney It is certified that error appears in the above-identified patent and that said Letters Patent is hereby corrected as shown below:

<u>Col. 17</u>
Line 42, delete "fermtoseconds," and insert -- femtoseconds, --, therefor.
Line 57, delete "Spectral-Physics" and insert -- Spectra-Physics --, therefor.

<u>Col. 18</u>
Line 18, delete "Imaging," and insert -- Imaging --, therefor.

<u>Col. 19</u>
Line 36, delete "higher" and insert -- high --, therefor.
Line 60, delete "for" and insert -- from --, therefor.

<u>Col. 20</u>
Line 31, delete "ethyhexyloxy)," and insert -- ethylhexyloxy), --, therefor.
Line 50, delete "mHz," and insert -- MHz, --, therefor.
Lines 56-57, delete "(numerical aperture 1,4," and insert -- (numeric aperture 1.4, --, therefor.

<u>Col. 21</u>
Line 2, delete "the" and insert -- that --, therefor.

<u>Col. 22</u>
Line 5, delete "pyrolysing" and insert --pyrolyzing --, therefor.
Line 19, delete "inveniton" and insert -- invention --, therefor.

<u>Col. 23</u>
Line 1, in Claim 2, delete "from" and insert -- for --, therefor.
Line 43, in Claim 2, after "1," insert -- b --.

UNITED STATES PATENT AND TRADEMARK OFFICE
CERTIFICATE OF CORRECTION

PATENT NO. : 7,297,374 B1
APPLICATION NO. : 11/024786
DATED : November 20, 2007
INVENTOR(S) : David S. Arney It is certified that error appears in the above-identified patent and that said Letters Patent is hereby corrected as shown below:

<u>Col. 24</u>
Line 17, in Claim 5, delete "atoms;" and insert -- atoms, --, therefor.
Line 25, in Claim 7, delete "represents" and insert -- represented --, therefor.
Line 41, in Claim 7, delete "h." and insert -- h; --, therefor.

Signed and Sealed this

Eighth Day of April, 2008

JON W. DUDAS
*Director of the United States Patent and Trademark Office*